(12) United States Patent
Hreish et al.

(10) Patent No.: US 6,538,538 B2
(45) Date of Patent: Mar. 25, 2003

(54) HIGH FREQUENCY PRINTED CIRCUIT BOARD VIA

(75) Inventors: Emad B. Hreish, Livermore, CA (US); Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/761,352

(22) Filed: Jan. 16, 2001

(65) Prior Publication Data

US 2002/0130737 A1 Sep. 19, 2002

Related U.S. Application Data

(63) Continuation-in-part of application No. 09/258,184, filed on Feb. 25, 1999, now Pat. No. 6,208,225.

(51) Int. Cl.$^7$ .................................................. H01P 3/08
(52) U.S. Cl. ............................................. 333/246; 333/185
(58) Field of Search ................................ 333/246, 247, 333/185

(56) References Cited

U.S. PATENT DOCUMENTS

| 4,342,013 A | 7/1982 | Kallman |
| 4,472,725 A | 9/1984 | Blumenkranz |
| 5,270,673 A | 12/1993 | Fries et al. |
| 5,424,693 A | 6/1995 | Lin |
| 5,536,906 A | 7/1996 | Haas, Jr. et al. |
| 5,719,750 A * | 2/1998 | Iwane .................... 361/794 |
| 6,208,225 B1 * | 3/2001 | Miller .................... 333/202 |
| 6,211,541 B1 | 4/2001 | Carroll et al. |
| 6,218,910 B1 | 4/2001 | Miller |

FOREIGN PATENT DOCUMENTS

| GB | 2303495 | * | 2/1997 |
| JP | 04-107940 | * | 4/1992 |
| WO | WO 00/50905 | | 8/2000 |
| WO | WO 00/51012 | | 8/2000 |
| WO | WO 00/51232 | | 8/2000 |

OTHER PUBLICATIONS

Hayward, "Introduction to Radio Frequency Design," pp. 59–68 (Prentice Hall 1982).

* cited by examiner

*Primary Examiner*—Robert Pascal
*Assistant Examiner*—Joseph Chang
(74) *Attorney, Agent, or Firm*—Smith-Hill and Bedell

(57) ABSTRACT

A printed circuit board (PCB) via, providing a conductor extending vertically between microstrip or stripline conductors formed on separate layers of a PCB, includes a conductive pad surrounding the conductor and embedded within the PCB between those PCB layers. The pad's shunt capacitance and the magnitudes of capacitances of other portions of the via are sized relative to the conductor's inherent inductance to optimize frequency response characteristics of the via.

30 Claims, 6 Drawing Sheets

HIGH FREQUENCY PRINTED CIRCUIT BOARD VIA

CROSS-REFERENCE TO RELATED APPLICATIONS

The present application is a continuation-in-part of U.S. application Ser. No. 09/258,184 U.S. Pat. No. 6,208,225, filed Feb. 25, 1999, and issued Mar. 27, 2001 to Charles A. Miller.

BACKGROUND OF THE INVENTION

1. Field of the Invention

The present invention relates in general to a via for providing a signal path between conductors formed on separate layers of a printed circuit board, and in particular to a via that acts as a tuned filter to optimize characteristics of its frequency response.

2. Description of Related Art

FIGS. 1 and 2 are plan and sectional elevation views of a portion of a prior art printed circuit board (PCB) employing a conductive via 12 to link a microstrip conductor 14 formed on an upper surface 16 of the PCB to a microstrip conductor 18 formed on a lower surface 20 of the PCB. Via 12 includes an upper cap (annular ring 22) contacting conductor 14, a lower cap (annular ring 24) contacting conductor 18 and a vertical conductor 26 extending between upper and lower annular rings 22 and 24. PCB 10 also includes embedded power and ground planes 28 formed on PCB substrate layers below upper surface 16 and above lower surface 20, and may also include additional embedded power, ground or signal planes 30. Via conductor 26 passes though holes in power signal planes 28 and 30 sufficiently large to prevent conductor 26 from contacting planes 28 and 30.

FIG. 3 is an impedance model of the path a signal follows through conductor 14, via 12 and conductor 18. Microstrip conductors 14 and 18, modeled by their characteristic impedances Z1 and Z2 respectively, are often sized and spaced with respect nearby power or ground planes 28 so that they have a standard characteristic impedance such as 50 Ohms. Upper and lower via annular rings 22 and 24 add shunt capacitances C1 and C2 to the signal path provided by vertical conductor 26. An inductor L1 models the vertical conductor 26. The model of FIG. 3 could also include some shunt resistance to account for leakage though the insulating substrate surrounding via 12, but at higher frequencies capacitances C1 and C2 and inductance L1 are the predominant influences on the via's frequency response.

Via 12, which behaves like a three-pole filter or passive network, can severely attenuate and distort a high frequency signal traveling between conductors 14 and 18. The series inductance L1 provided by vertical conductor 26 depends primarily on its vertical dimension. Since vertical conductor 26 must extend through PCB 10, its length is fixed by the thickness of PCB 10, and there is generally little leeway in adjusting the value of L1. Thus the conventional approach to reducing signal distortion and attenuation caused by via 12 in high frequency applications has been to minimize the via's shunt capacitance. The shunt capacitance C1 and C2 can be reduced by reducing the horizontal dimension of annular rings 22 and 24 and by maximizing the distance between annular rings 22 and 24 and nearby power and ground planes 28. However there are practical limits to the amount by which capacitances C1 and C2 can be reduced. Therefore appreciable via capacitance and inductance will always be present and will always cause some level of signal distortion and attenuation, particularly in high frequency signals.

FIG. 4 includes a plot A of the frequency response of a typical via that has been designed to provide minimal shunt capacitance and series inductance. The bandwidth of a filter is normally defined as the lowest frequency at which it attenuation reaches −3db. Plot A of FIG. 4 shows that the bandwidth of via 22 is approximately 3.2 GHz. Thus a circuit board designer would normally want to avoid using such a circuit board via to conduct a signal of frequency higher than about 3 GHz.

The conventional approach to the use of vias in high frequency applications is therefore quite often to avoid them entirely. However a restriction against using vias can make it difficult to route large numbers of high frequency signals on a circuit board. In some high frequency applications short "blind" vias which do not extend completely through a PCB are used to link embedded stripline conductors formed on PCB layers that are vertically close to one another. Since blind vias are short, they have relatively little series inductions, and therefore usually have larger bandwidths than through vias extending completely through a PCB. However blind vias are more expensive than through vias, and still do not have sufficient bandwidth to handle very high frequency signals.

Therefore what is needed is a way to substantially increase the bandwidth of PCB vias so that they can conduct very high frequency signals without unduly attenuating or distorting them.

SUMMARY OF THE INVENTION

A printed circuit board (PCB) via provides a vertical signal path between microstrip or stripline conductors formed on separate horizontal layers of a PCB. The via adds shunt capacitance and series inductance to the signal path that are functions of shape and size of the via and of spacing between the via and nearby power and ground planes implemented in the PCB.

In accordance with one aspect of the invention, the capacitances of the via are adjusted with respect to one another and to the via inductance to values above their minimum practically attainable values for which frequency response characteristics of the via such as bandwidth are optimized.

In accordance with another aspect of the invention, in particular embodiments thereof, the via capacitances are adjusted so that the via behaves as a multi-pole Chebyshev or Butterworth filter.

In accordance with a further aspect of the invention, the via includes a capacitive element embedded within the PCB in contact with the signal path provided by the via. The element's shunt capacitance and the magnitudes of capacitances of other portions of the via are adjusted relative to via's inherent series inductance and to the impedance of the stripline or microstrip conductors to tune the via for optimal frequency response characteristics.

It is accordingly an object of the invention to provide a PCB via conducting high frequency signals without unduly attenuating them.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 5:
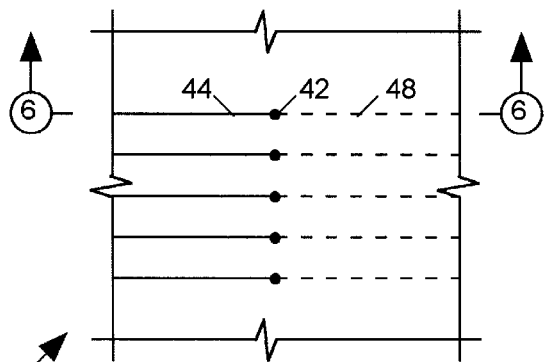
FIG. 5 is a plan view of a portion of a printed circuit board employing a conductive via in accordance with the invention to link microstrip conductors formed on upper and lower surfaces of the PCB.
Figure 6:
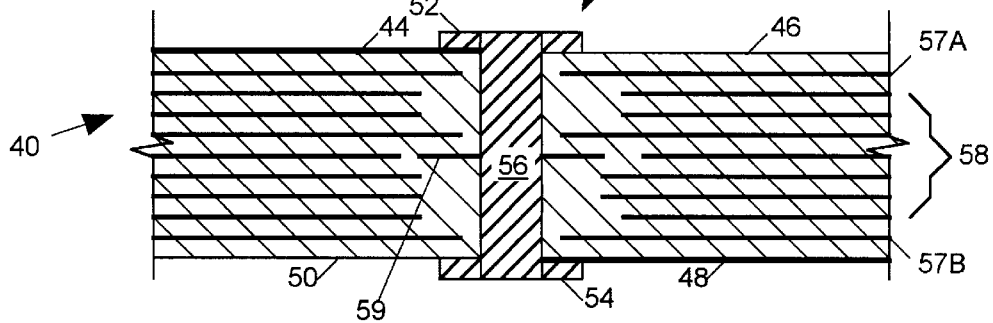
FIG. 6 is a sectional elevation view of the PCB of FIG. 5.

FIGS. 5 and 6 are plan and sectional elevation views of a portion of a multi-layer printed circuit board (PCB) 40 employing a conductive via 42 in accordance with the invention to link a microstrip conductor 44 formed on an upper surface 46 of PCB 40 to a microstrip conductor 48 formed on a lower surface 50 of the PCB. Via 42 includes an upper cap (annular ring 52) contacting conductor 34, a lower cap (annular ring 54) for contacting conductor 18 and a vertical conductor 56 extending between upper and lower annular rings 52 and 54. PCB 40 also includes power and ground planes 57A, 57B formed on substrate layers below upper surface 46 and above lower surface 50, and may also include additional embedded power and ground planes or signal planes 58 formed on other layers. Vertical conductor 56 passes though holes in power signal planes 57A, 57B and 58 that are sufficiently large to prevent conductor 56 from contacting planes 57A, 57B and 58.

In accordance with the invention a capacitor is added to via 42 suitably embedded midway between upper and lower rings 52 and 54. The capacitor may be provided by lithographically forming a conductive pad 59 on one of the PCB's multiple substrate layers from the same metallic material from which the conductors of the power, ground or signal plane 58 residing on that layer are lithographically formed before the individual substrate layers of PCB 40 are joined. When a hole is drilled though PCB 40 and pad 59, and filled with conductive material to from conductor 56, pad 59 forms an annular ring that surrounds and contacts conductor 56. The horizontal surfaces of pad 59 and an adjacent power or ground plane 58 act as a capacitor adding shunt capacitance to the signal path provided by vertical conductor 56.

Figure 7:
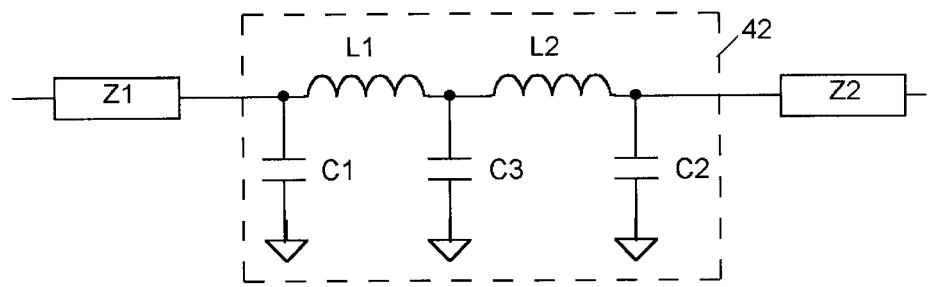
FIG. 7 is a schematic diagram depicting an impedance model of a signal path through the microstrip conductors and the via of FIG. 6 when employing a microstrip conductor configuration depicted in FIG. 8.

FIG. 7 is an impedance model of the path a signal follows through conductor 44, via 42 and conductor 48. Microstrip conductors 44 and 48 are modeled by their characteristic impedances Z1 and Z2, respectively. Microstrip conductors are often sized and spaced with respect to their nearest power or ground planes 57A, 57B so that they have a standard characteristic impedance such as 50 Ohms. Upper and lower rings 52 and 54 add capacitances C1 and C2, respectively, between the signal path and nearest power or ground planes 58. A capacitor C3 models the capacitance between pad 59 and its nearby power or ground planes 58. Inductors L1 and L2 respectively model the inductance of the portion of vertical conductor 56 above and below pad 59. The impedance model of FIG. 7 could also include some shunt resistance to model leakage through the surrounding PCB substrate insulating material, but at high signal frequencies the capacitive and inductive elements dominate the frequency response of via 42.

As seen in FIG. 7, via 42 acts as a five-pole filter. In high frequency applications the via's series inductances L1 and L2 and shunt capacitances C1 –C3 attenuate and distort a signal traveling between conductors 44 and 48. The higher the frequency of the signal, the greater the attenuation and distortion. If via had no impedance, it would not attenuate or distort the signal at all. Hence the conventional approach to reducing signal distortion and attenuation has been to reduce the via's shunt capacitance. For example shunt capacitances C1 and C2 can be reduced by reducing the horizontal dimension of rings 52 and 54 and by increasing the distance between rings 52 and 54 their nearest power or ground planes 57A, 57B. However there are practical limits to the amount by which capacitances C1 and C2 can be reduced. The series inductances L1 and L2 of vertical conductor 56 also decrease primarily with its vertical dimension. However since vertical conductor 56 must extend through PCB 40, its length is fixed by the thickness of PCB 40, and there is little leeway in adjusting values of L1 and L2.

Figure 1:
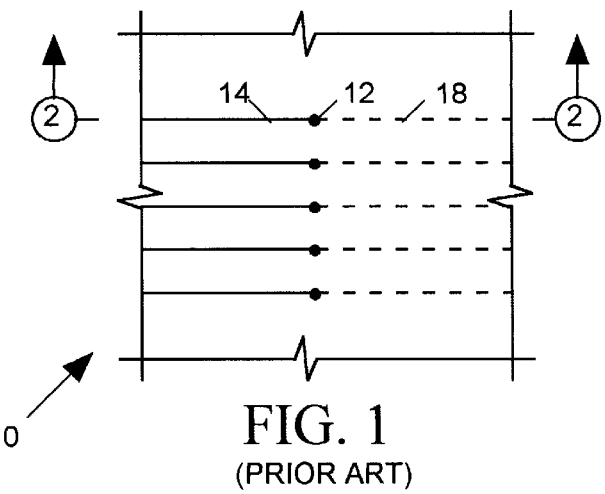
FIG. 1 is a plan view of a portion of a prior art printed circuit board (PCB) employing a conductive via to link microstrip conductors formed on upper and lower surfaces of the PCB.
Figure 2:
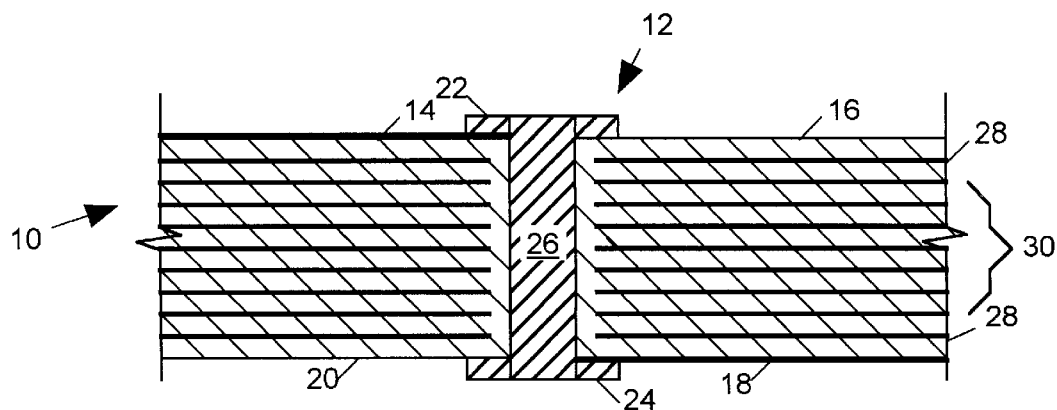
FIG. 2 is a sectional elevation view of the PCB of FIG. 1.
Figure 3:
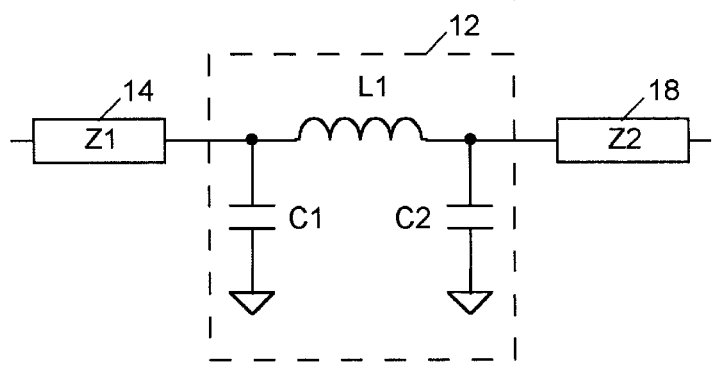
FIG. 3 is a schematic diagram depicting an impedance model of a path a signal follows through the microstrip conductors and the via of FIG. 2.

Therefore appreciable via capacitance and inductance will always be present and will always cause signal distortion and attenuation. As discussed below, the present invention, increases the bandwidth and improves other frequency response characteristics of a via beyond what can be obtained by simply minimizing the via's shunt capacitance.
Tuning Via Capacitance FIG. 2 is a sectional elevation view of a prior art via 12 (FIG. 2) that is generally similar to via 42 of FIG. 5 of the present invention except that via 12 does not include pad 59 of via 42. FIG. 3 is an impedance model of via 12 including capacitances C1 and C2 associated with its upper and lower rings 22 and 24 and an inductance L1 associated with its vertical conductor 26. Note that capacitances C1 and C2 and inductor L1 form a two-port, three-pole filter as opposed to the five-pole filter of FIG. 7.

Figure 4:
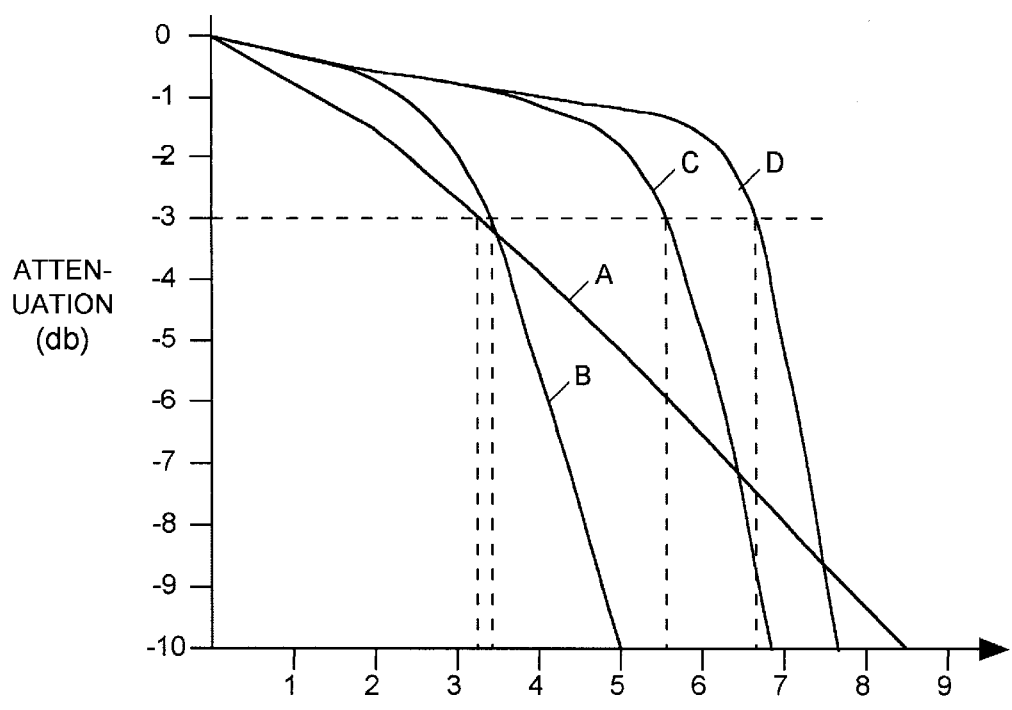
FIG. 4 is a graph illustrating frequency responses the vias of FIGS. 2 and 6.

FIG. 4, plot A, depicts the frequency response of prior art via 12 when the various components of the three-pole filter of FIG. 3 have the values shown below in the Table I.

TABLE I

| Z1 | 50 ohms |
|---|---|
| Z2 | 50 ohms |
| C1 | 0.17 pF |
| C2 | 0.17 pF |
| L1 | 4.32 nH |

The 0.17 pF values of C1 and C2 are typical minimum attainable via capacitance values.

The "bandwidth" of a filter is often defined as the lowest signal frequency at which the filter's attenuation reaches −3 db. Plot A of FIG. 5 shows the bandwidth of prior art via 22 to be approximately 3.2 GHz. Following conventional practice, we might expect that an increase in the capacitance C1 and C2 of rings 22 and 24 would result in a decrease in the bandwidth of via 22. However that is not the case for all values of capacitance to which we might increase C1 and C2. FIG. 4, plot B, illustrates the frequency response of the filter of FIG. 3 when component values are as listed below in Table II.

TABLE II

| Z1 | 50 ohms |
|---|---|
| Z2 | 50 ohms |
| C1 | 0.88 pF |
| C2 | 0.88 pF |
| L2 | 4.21 nH |

Note the capacitances C1 and C2 are increased by more than a factor of five while values of via inductance L1 and microstrip impedance Z1 and Z2 remain unchanged. Plot B of FIG. 4 shows that by increasing via capacitance we increase the via's bandwidth from about 3.2 GHz to about 3.5 GHz. We do not necessarily maximize a via's bandwidth by making its capacitances as low as possible; instead we maximize bandwidth by tuning the via's capacitances to appropriate values in relation to the via's inductance. We treat the via like a filter that we can tune for optimal frequency response.

Thus we optimize a via's frequency response not by minimizing its capacitance but by appropriately tuning its capacitance. However the "optimal" frequency response of a via is application-dependent. In most high frequency applications we normally want to maximize via bandwidth. But in some high frequency applications we may be willing, for example, to accept a narrower bandwidth in exchange for a flatter passband, less attenuation at lower frequencies, or steeper roll off in the stopband. Since via 12 of FIG. 2 and via 42 of FIG. 6 form three-pole and five-pole filters, by appropriately adjusting via capacitance, these vias can be made to behave like well-known three-pole or five-pole "Butterworth" filters which provide a maximally flat frequency response or like well-known multi-pole Chebyshev filters which can optimize a combination of bandwidth and roll off characteristics. The design of multi-pole Butterworth and Chebyshev filters, including appropriate choices for component values so as to optimize various characteristics of a filter's frequency response, is well-known to those skilled in the art. See for example, pages 59–68 of the book *Introduction to Radio Frequency Design* by W. H. Hayward, published 1982 by Prentice-Hall, Inc., and incorporated herein by reference.

Distributing Via Capacitance

Adding pad 59 to via 42 is inconsistent with the conventional practice of attempting to minimize a via's capacitance in order to improve the via's high frequency response because pad 59 adds shunt capacitance C3 to the via's signal path. However, as demonstrated below, when that capacitance C3 and appropriately adjusted relative to capacitances C1 and C2 and inductances L1 and L2 of other portions of via 42, the via's frequency response characteristics is greatly improved.

FIG. 4, plot C, illustrates the frequency response of the five-pole filter of FIG. 7 modeling the improved via 42 of FIG. 6 with component values as listed in Table III below.

TABLE III

| Z1 | 50 ohms |
|---|---|
| Z2 | 50 ohms |
| C1 | 0.4 pF |
| C2 | 0.4 pF |
| C3 | 1.0 pF |
| L1 | 2.16 nH |
| L2 | 2.16 nH |

We see from plot C that the bandwidth of via 42 is about 5.6 GHz, substantially larger than the 3.2 and 3.5 GHz bandwidths of the "minimum capacitance" and "tuned capacitance" versions of via 12 of FIG. 2 having frequency responses illustrated in plots A and B of FIG. 4. Note also that via 42 has a total shunt capacitance of 1.8 pF, substantially more than the 0.34 pF total capacitance added by the minimum capacitance version of via 12 and about the same as the 1.76 pF capacitance added by the tuned capacitance version of via 12.

By comparing plots A and B, we saw that we can improve the frequency response of a via by properly tuning its capacitance, rather than by trying to minimize it. Also we can see by comparing plot C to plots A and B, that we can obtain a far greater increase in the frequency response of a via when we also more evenly distribute the via's capacitance over its vertical length. For example further bandwidth increases would result if several capacitive pads 59 were evenly distributed along the length of vertical conductor 56 with their capacitances and the capacitances of upper and lower rings 52 and 54 appropriately tuned in relation to the via's inductance. Generally the more poles we can add to the filter formed by the via, the greater the bandwidth that can be obtained provided all of the impedance elements can be properly tuned. Increasing the number of poles can also help to flatten the filter's pass band and sharpen the high frequency roll off of its stop band, which are also desirable improvements to frequency response characteristics in many applications.

Adding Via Inductance

Figure 8:
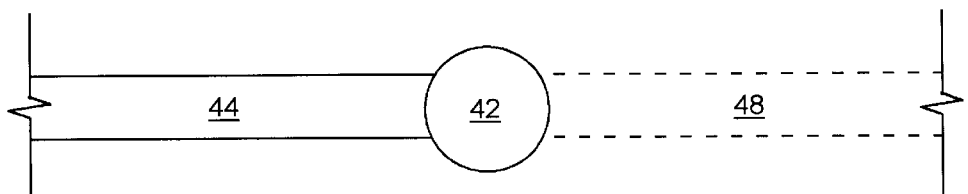
FIG. 8 is a plan view of the microstrip conductors and via of FIGS. 5 and 6.
Figure 9:
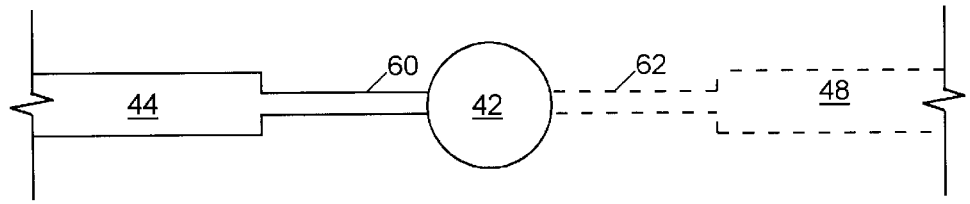
FIG. 9 is a plan view of an alternative embodiment of the microstrip conductors and via of FIGS. 5 and 6.

FIGS. 8 and 9 are plan views of alternative versions of microstrip conductors 44 and 48 and via 42 of FIG. 5. The impedance of a microstrip conductor is primarily a function of its width and the distance between the conductor and nearby power or ground planes. Normally a microstrip conductor is designed to have a uniform characteristic impedance throughout its length, such as for example 50 Ohms. Therefore they normally have uniform widths as shown in FIG. 8. The impedance model of FIG. 7 assumes that microstrip conductors 44 and 48 are of uniform width. However by decreasing the widths of microstrip conductors 44 and 48 in sections 60 and 62 near via 42 as illustrated in FIG. 9, we make those sections primarily inductive.

Figure 10:
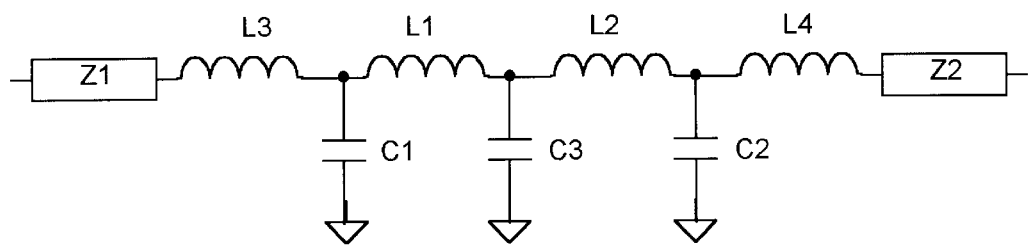
FIG. 10 is a schematic diagram depicting an impedance model of a signal path through the microstrip conductors and the via of FIG. 6 when employing the microstrip configuration depicted in FIG. 9.

FIG. 10 depicts an impedance model of a signal path formed by conductor 44, via 42 and conductor 48, when conductors 44 and 48 have been modified to include inductive sections 60 and 62 as illustrated in FIG. 9. In addition to the capacitances C1–C3 and inductances L1 and L2 of via 42, the structure between the Z1 and Z2 characteristic impedances associated with conductors 44 and 48 includes the inductances L3 and L4 of conductor sections 60 and 62. Thus the structure between conductors 44 and 48 acts as a seven-pole filter.

FIG. 4, plot D, illustrates the frequency response of the seven-pole filter of FIG. 10 when impedance components having values listed below in Table IV.

TABLE IV

| | |
|---|---|
| Z1 | 50 ohms |
| Z2 | 50 ohms |
| L1 | 2.16 nH |
| L2 | 2.16 nH |
| L3 | 0.77 nH |
| L4 | 0.85 nH |
| C1 | 0.72 pF |
| C2 | 0.74 pF |
| C3 | 0.74 pF |

Plot D shows that the seven-pole filter structure of FIG. 10 has a bandwidth of about 6.8 GHz, substantially higher than the bandwidth of the five-pole filter of FIG. 7. (See plot C.) Thus we can see that even though the seven-pole filter of FIG. 10 has substantially more capacitance and inductance than the five-pole filter of FIG. 7 and than either of the minimum capacitance or tuned capacitance versions the three-pole filter of FIG. 3, it has a much larger bandwidth. Thus in addition improving a via's frequency response by tuning and more evenly distributing its capacitance, we can further improve its frequency response by adding appropriately sized inductance at the via's upper and lower ends. This increases the number of poles of the filter structure linking the two microstrip traces.

Tuned Vias for Interconnecting Buried Stripline Conductors

Vias are also used to interconnect stripline conductors formed on separate buried layers of a PCB substrate. PCB designers often employ blind or buried vias which do not extend all the way through the PCB in lieu of through vias which do extend all the way through a PCB to interconnect buried conductors because the shorter blind and buried vias do not add as much capacitance or inductance to the signal paths. However blind and buried vias are more expensive to manufacture than through vias since various PCB layers must be separately drilled. The present invention improves the bandwidth of through vias so that they can be used for interconnecting buried stripline conductors in high frequency applications.

Figure 11:
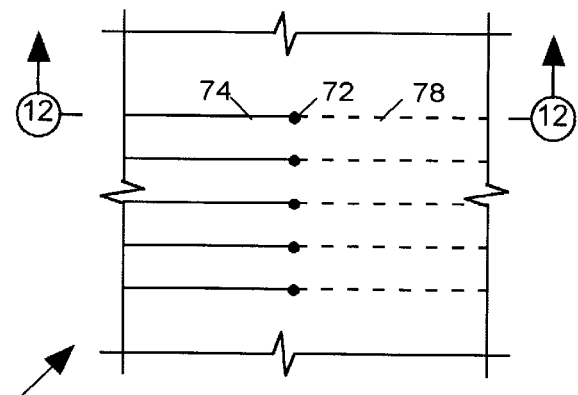
FIG. 11 is a plan view of a portion of a prior art PCB employing a conductive via in accordance with the invention to link embedded stripline conductors formed on separate layers of the PCB.
Figure 12:
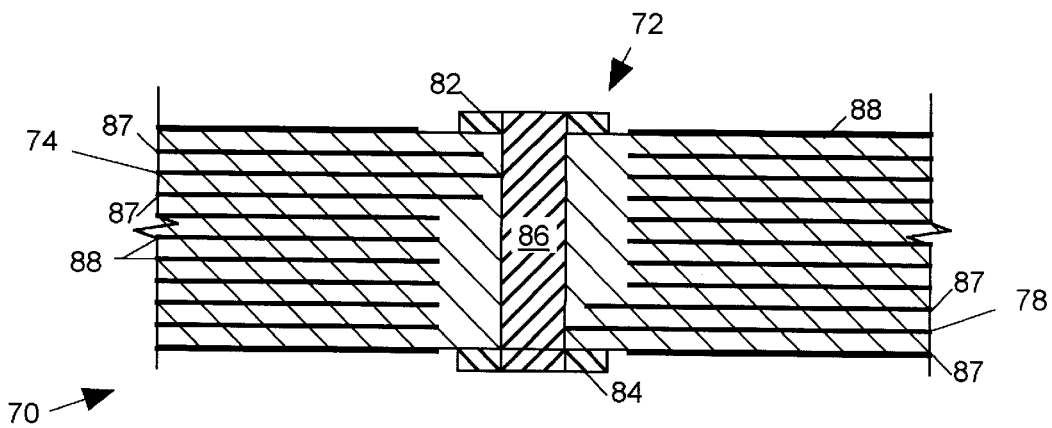
FIG. 12 is a sectional elevation view of the PCB of FIG. 11.

FIGS. 11 and 12 are a plan and sectional elevation views of a portion of a multi-layer printed circuit board (PCB) 70 employing a prior art conductive via 72 in accordance with the invention to link a stripline conductor 74 formed on a buried layer of PCB 70 to a stripline conductor 78 formed on another buried layer of the PCB. Via 72 includes an upper annular ring 82, a lower annular ring 84, a vertical conductor 86 extending between upper and lower annular rings 82 and 84. PCB 40 also includes power and ground planes 87 formed on layers above and below stripline conductors 74 and 78, and also includes additional embedded power, ground or signal planes 88 formed on other layers. Vertical conductor 86 passes though holes in power signal planes 87 and 88 that are sufficiently large to prevent conductor 86 from contacting planes 87 and 88. However stripline conductors 74 and 78 do contact vertical conductor 88 so that via 72 can provide a signal path between conductors 74 and 78.

Figure 13:
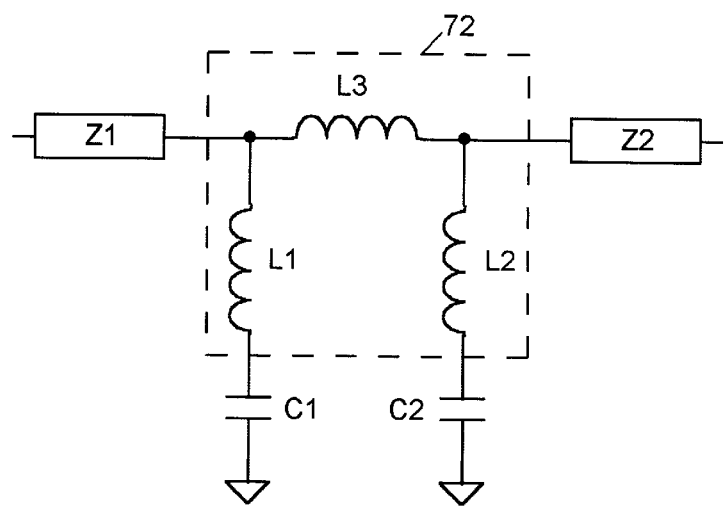
FIG. 13 is a schematic diagram depicting an impedance model of a path a signal follows through the microstrip conductors and the via of FIG. 12.

FIG. 13 is an impedance model of the path a signal follows through conductor 74, via 72 and conductor 78. Stripline conductors 74 and 78 are modeled by their characteristic impedances Z1 and Z2, respectively. Upper and lower rings 82 and 84 add shunt capacitances C1 and C2, respectively, between the signal path and ground. Inductor L1 models the inductance of vertical conductor 86 between upper ring 82 and conductor 74. Inductor L3 represents the inductance of conductor 86 between conductors 74 and 78. Inductor L2 models the inductance of conductor 86 between conductor 78 and lower ring 84.

Figure 14:
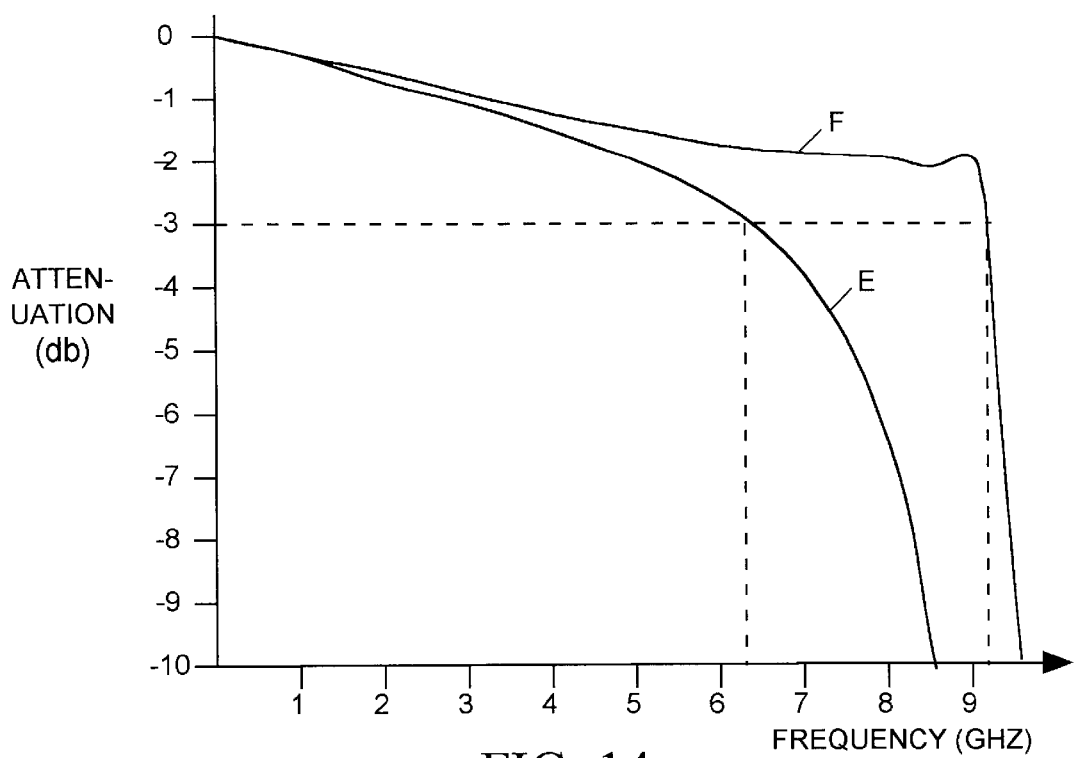
FIG. 14 is a graph illustrating the frequency responses the vias of FIGS. 12 and 15.

FIG. 14, plot E, illustrates the frequency response of the prior art five-pole filter structure of FIG. 13 when its capacitances C1 and C2 are tuned relative to inductances L1–L3 in accordance with the invention to provide maximum bandwidth. The impedance values listed below in Table V were used when computing plot E.

TABLE V

| | |
|---|---|
| Z1 | 50 ohms |
| Z2 | 50 ohms |
| L1 | 1.1 nH |
| L2 | 1.1 nH |
| L3 | 2.2 nH |
| C1 | 0.2 pF |
| C2 | 0.2 pF |

Note from plot E that the five-pole filter of FIG. 14 has a bandwidth of approximately 6.3 GHz. This is much larger than the 3.5 GHz bandwidth of the capacitance-tuned version of the three-pole filter of FIG. 3 (See plot C of FIG. 4) because inductances L1 and L2 of FIG. 13 are shunt inductances rather than series inductances and serve to isolate upper and lower ring capacitances C1 and C2 from the signal path.

Figure 15:
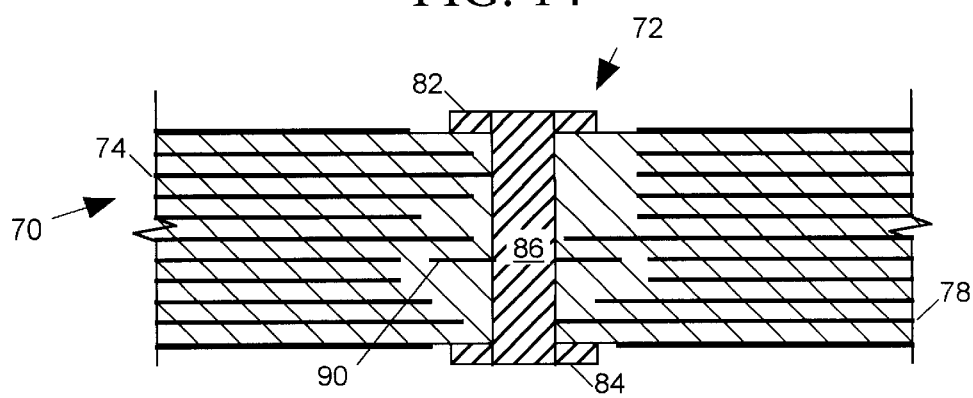
FIG. 15 is a sectional elevation view of a printed circuit board employing a conductive via in accordance with a first alternative embodiment of the invention.

FIG. 15 is a sectional elevation view of PCB 70 of FIGS. 11 and 12 wherein, in accordance with the invention, a conductive pad 90 adds shunt capacitance to via 72 at a point along vertical conductor 56 midway between conductors 74 and 78.

Figure 16:
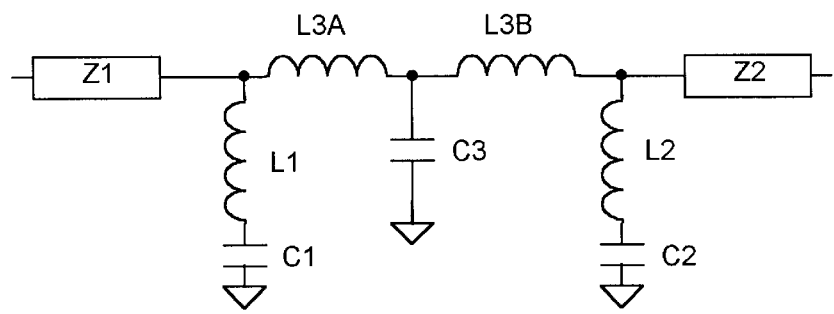
FIG. 16 is a schematic diagram depicting an impedance model of a signal path through the stripline conductors and the via of FIG. 15.

FIG. 16 is an impedance model of via 72 when ring 90 is added. Capacitance C3 model the capacitance of ring 90. Inductors L3A and L3B represent portions of the inductance L3 of FIG. 13 provided by vertical conductor 56 between conductors 74 and 78. Note that the via acts as a seven-pole filter. Plot F of FIG. 14 illustrates the frequency response of the seven-pole filter of FIG. 16 using impedance components listed below in table VI.

TABLE VI

| | |
|---|---|
| Z1 | 50 ohms |
| Z2 | 50 ohms |
| L1 | 1.1 nH |
| L2 | 1.1 nH |
| L3A | 1.1 nH |
| L3B | 1.1 nH |
| C1 | 0.2 pF |
| C2 | 0.2 pF |
| C3 | 0.8 pF |

Comparing plots E and F we see that the addition of pad 90 with properly tuned capacitance to via 72 can increase the via's bandwidth from about 6.3 GHz to about 9.3 GHz.

We can further increase the bandwidth of the via by making the ends of stripline 74 and 78 inductive for example by decreasing their widths near the via, as discussed above in connection with the microstrip version of the invention illustrated in FIG. 9. Since the additional series inductance between Z1 and L3A and between Z2 and L3B turns the seven-pole filter of FIG. 16 to a nine-pole filter can be tuned for increased bandwidth.

Via Employing Multiple Embedded Capacitors

Figure 17:
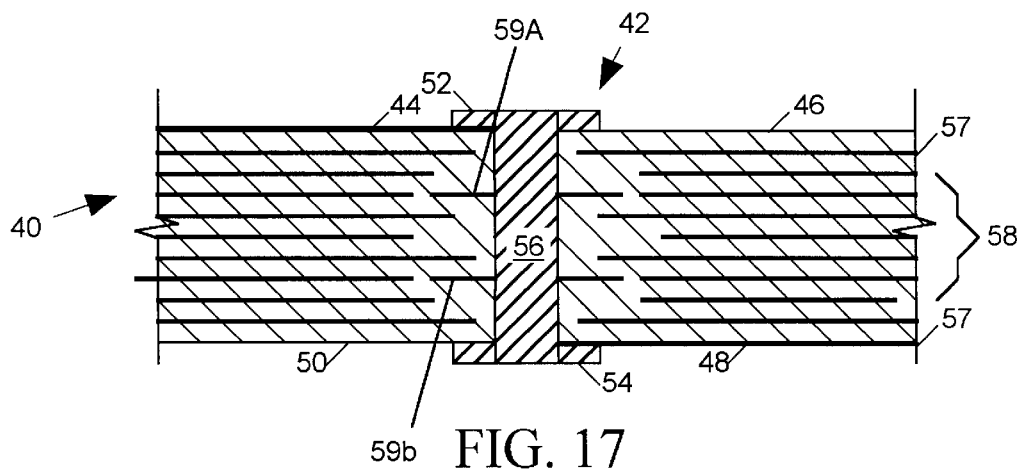
FIG. 17 is a sectional elevation view of a printed circuit board employing a conductive via in accordance with a second alternative embodiment of the invention.
Figure 18:
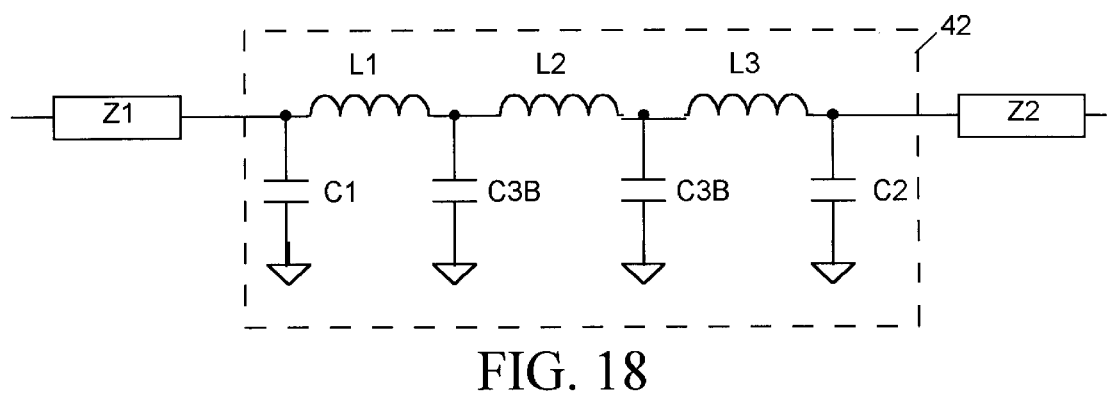
FIG. 18 is a schematic diagram depicting an impedance model of a signal path through the stripline conductors and the via of FIG. 17.

Additional improvements in bandwidth may be had by providing more than one appropriately tuned pad 90 between conductors 74 and 78 to more evenly distribute via capacitance. For example FIG. 17 illustrates an improved version of the via 42 of FIG. 6 in accordance with an alternative embodiment of the invention. In FIG. 6 via 42 includes only a single conductive pad 59 embedded in PCB 40 to provide additional shunt capacitance at a single point along the the signal path provided by via 42. Conductive pad 59 turned via 42 into the five-pole filter illustrated in FIG. 7. Conductor 56 acts as two series inductors L1 and L2 while upper and lower rings 52 and 54 and pad 59 act as capacitors C1, C2 and C3, respectively.

In the version of via 42 illustrated in FIG. 17, two conductive pads 59A and 59B are embedded in PCB 40 (rather than on) to provide additional shunt capacitance at two points along the signal path provided by via 42 between conductors 44 and 48. As illustrated in FIG. 17, conductor 56 now acts as three series inductors L1–L3 while upper and lower rings 52 and 54 and pads 59A and 59B act as capacitors C1, C2, C3A and C3B, respectively. Thus via 42 of FIG. 17 acts as a seven-pole filter, which can be tuned for wider bandwidth than the five-pole filter of FIG. 7 given similar amounts of total series inductance. When a PCB has a large number of layers, we can add additional embedded capacitors to the via to further increase the number of poles in the filter it forms.

While the forgoing specification has described preferred embodiment(s) of the present invention, one skilled in the art may make many modifications to the preferred embodiment without departing from the invention in its broader aspects. For example, the impedance values listed in Tables I–VI are exemplary only. Those of skill in the art will understand that vias designed in accordance with the invention may have other combinations impedance values. It should also be understood that the frequency response of blind and buried vias can also be improved in accordance with the invention by properly tuning their capacitive elements and by adding properly sized capacitive and/or inductive elements to the vias. The appended claims therefore are intended to cover all such modifications as fall within the true scope and spirit of the invention.

We claim:

1. An apparatus for conducting a signal between a first conductive strip and a second conductive strip residing at separate first and second elevations on a printed circuit board (PCB), the apparatus comprising:
   a conductor extending vertically within the PCB and providing a conductive path for conducting the signal between the first conductive strip and the second conductive strip, the conductor having impedance including inductance; and
   capacitive means in contact with the conductor and adding shunt capacitance to the conductive path, wherein the shunt capacitance is sized relative to the conductor's impedance to substantially optimize a frequency response characteristic of the conductive path when conducting the signal.

2. The apparatus in accordance with claim 1 wherein the shunt capacitance is sized relative to the conductor's impedance such that the conductive path forms a Chebyshev filter.

3. The apparatus in accordance with claim 1 wherein the shunt capacitance is sized relative to the conductor's impedance such that the conductive path forms a Butterworth filter.

4. The apparatus in accordance with claim 1 wherein the shunt capacitance is sized relative to the conductor's impedance to substantially maximize a bandwidth characteristic of a frequency response of the conductive path when conducting the signal.

5. The apparatus in accordance with claim 1
   wherein the PCB has an upper horizontal surface and a lower horizontal surface;
   wherein the first conductive strip resides on the upper horizontal surface;
   wherein the second conductive strip resides on the lower horizontal surface;
   wherein the conductor extends vertically completely through the PCB; and
   wherein said capacitive means comprises:
      an upper conductor having a first horizontally planar surface formed on the upper surface conductively linking the conductor to the first conductive strip, and
      a lower conductor having a horizontally planar surface formed on the lower surface conductively linking the conductor to the second conductive strip.

6. The apparatus in accordance with claim 5
   wherein the upper conductor adds first shunt capacitance to the conductive path,
   wherein the lower conductor adds second shunt capacitance to the conductive path, and
   wherein the first and second shunt capacitances are sized relative to the conductor's impedance to substantially optimize a frequency response characteristic of the conductive path when conducting the signal.

7. The apparatus in accordance with claim 1 wherein the capacitive means comprises a first capacitor embedded within said PCB attached to the conductor at a third elevation between the first and second elevations, said first capacitor adding first shunt capacitance to the signal path.

8. The apparatus in accordance with claim 7 wherein the third elevation resides substantially vertically midway between the first and second elevations.

9. The apparatus in accordance with claim 8 wherein the first conductive material surrounds the conductor.

10. The apparatus in accordance with claim 7
    wherein the PCB has a plurality of substrate layers and,
    wherein the first capacitor comprises first conductive material formed at the third elevation on one of the substrate layers in contact with the conductor and having a first horizontally planar surface.

11. The apparatus in accordance with claim 10 wherein the first capacitor further comprises second conductive material having a second horizontally planar surface residing proximate to the first planar surface of the first conductive material.

12. The apparatus in accordance with claim 7
    wherein the PCB has an upper horizontal surface and a lower horizontal surface;
    wherein the first conductive strip resides on the upper horizontal surface;
    wherein the second conductive strip resides on the lower horizontal surface;
    wherein the conductor extends vertically completely through the PCB; and
    wherein said at least one capacitor comprises:
       an upper conductor having a horizontally planar surface formed on the upper surface conductively linking the conductor to the first conductive strip, and
       a lower conductor having a horizontally planar surface formed on the lower surface conductively linking the conductor to the second conductive strip.

13. The apparatus in accordance with claim 12
wherein the upper conductor having a horizontally planar surface provides second shunt capacitance to the conductive path;
wherein the lower conductor having a horizontally planar surface provides third shunt capacitance to the conductive path; and
wherein the first, second and third shunt capacitances are sized relative to the conductor's impedance to substantially optimize a frequency response characteristic of the conductive path when conducting the signal.

14. The apparatus in accordance with claim 13 wherein the first, second and third shunt capacitances are sized relative to the conductor's impedance such that the conductive path forms a Chebyshev filter when conducting the signal.

15. The apparatus in accordance with claim 13 wherein the first, second and third shunt capacitances are sized relative to the conductor's impedance such that the conductive path forms a Butterworth filter when conducting the signal.

16. The apparatus in accordance with claim 13 wherein the first, second and third shunt capacitances are sized relative to the conductor's impedance such that the conductive path has substantially maximal bandwidth when conducting the signal.

17. The apparatus in accordance with claim 7
wherein the PCB has an upper horizontal surface and a lower horizontal surface;
wherein the first elevation resides below the upper horizontal surface;
wherein the second elevation resides above the lower horizontal surface;
wherein the conductor extends vertically completely through the PCB; and
wherein said capacitive means comprises:
an upper conductor having a horizontally planar surface formed on the upper surface conductively linking the conductor to the first conductive strip, and
a lower conductor having a horizontally planar surface formed on the lower surface conductively linking the conductor to the second conductive strip.

18. The apparatus in accordance with claim 17
wherein the upper conductor adds second shunt capacitance to the conductive path;
wherein the lower conductor adds third shunt capacitance to the conductive path; and
wherein the first, second and third shunt capacitances are sized relative to the conductor's impedance to substantially optimize a frequency response characteristic of the conductive path when conducting the signal.

19. The apparatus in accordance with claim 18 wherein the first, second and third shunt capacitances are sized relative to the conductor's impedance such that the conductive path has substantially maximal bandwidth when conducting the signal.

20. The apparatus in accordance with claim 1 wherein the capacitive means comprises a plurality of capacitors embedded within said PCB and attached to the conductor at elevations between the first and second elevations.

21. An improvement to a printed circuit board (PCB) via including a conductor providing a conductive path for conducting a signal between a first conductive strip and a second conductive strip formed at separate first and second elevations of the PCB, the improvement comprising:
a capacitor embedded within the PCB in contact with the conductor and providing substantial first shunt capacitance at a position along the conductor between the first and second elevations.

22. The improvement to a PCB via in accordance with claim 21 wherein the conductor has impedance, and wherein the first shunt capacitance is sized relative to the conductor's impedance to substantially optimize a frequency response characteristic of the conductive path.

23. The improvement to a PCB via in accordance with claim 21 wherein the conductor has impedance, and wherein the first shunt capacitance is sized relative to the conductor's impedance to substantially maximize a bandwidth of a frequency response of the conductive path.

24. An apparatus for conducting a signal between a first conductive strip residing on an upper surface of a printed circuit board (PCB) and a second conductive strip residing on a lower surface of a printed circuit board, the apparatus comprising:
a conductor extending vertically within the PCB and providing a signal path for conducting the signal, said conductor having impedance including first series inductance;
first capacitive means formed on the upper surface of the PCB in contact with the conductor and adding first shunt capacitance to the signal path;
second capacitive means formed on the lower surface of the PCB in contact with the conductor and adding second shunt capacitance to the signal path;
a first inductor formed on the upper surface of the PCB linking the first conductive strip to the conductor having a horizontally planar surface and adding second series inductance to the signal path;
a second inductor formed on the surface of the PCB linking the second conductive strip to the lower conductor having a horizontally planar surface and adding third series inductance to the signal path.

25. The apparatus in accordance with claim 24 wherein the second and third series inductances and the first and second shunt capacitances are sized relative to the conductor's impedance to optimize a frequency response characteristic of the signal path.

26. The apparatus in accordance with claim 24 wherein the second and third series inductances and the first and second shunt capacitances are sized relative to the conductor's impedance such that the conductive path forms a Butterworth filter.

27. The apparatus in accordance with claim 24 wherein the second and third series inductances and the first and second shunt capacitances are sized relative to the conductor's impedance such that the conductive path forms a Chebyshev filter.

28. The apparatus in accordance with claim 24 wherein the second and third series inductances and the first and second shunt capacitances are sized relative to the conductor's impedance to substantially maximize a bandwidth of the conductive path.

29. The apparatus in accordance with claim 24 further comprising a third capacitive means embedded within said PCB, attached to the conductor at a third elevation between the first and second elevations, and adding third shunt capacitance to the signal path.

30. The apparatus in accordance with clam 29 wherein the first, second and third shunt capacitances and the second and third series inductances are sized to substantially maximize a bandwidth of the conductive path.

* * * * *